(12) United States Patent
Hung et al.

(10) Patent No.: US 10,269,840 B2
(45) Date of Patent: Apr. 23, 2019

(54) IMAGE SENSING DEVICE AND MANUFACTURING METHOD THEREOF

(71) Applicant: TAIWAN SEMICONDUCTOR MANUFACTURING CO., LTD., Hsinchu (TW)

(72) Inventors: Feng-Chi Hung, HsinChu County (TW); Jen-Cheng Liu, Hsinchu County (TW); Ching-Chun Wang, Tainan (TW); Tse-Hua Lu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 112 days.

(21) Appl. No.: 15/487,593

(22) Filed: Apr. 14, 2017

(65) Prior Publication Data

US 2018/0301486 A1 Oct. 18, 2018

(51) Int. Cl.
| | |
|---|---|
| *H04N 3/14* | (2006.01) |
| *H04N 5/335* | (2011.01) |
| *H04N 9/04* | (2006.01) |
| *H04N 5/225* | (2006.01) |
| *H01L 31/062* | (2012.01) |
| *H01L 31/113* | (2006.01) |
| *H01L 27/146* | (2006.01) |

(52) U.S. Cl.
CPC .. *H01L 27/14614* (2013.01); *H01L 27/14636* (2013.01); *H01L 27/14643* (2013.01); *H01L 27/14687* (2013.01); *H01L 27/14689* (2013.01)

(58) Field of Classification Search
CPC ........... H01L 27/1463; H01L 27/14645; H01L 27/14643; H01L 27/14636; H01L 27/1464; H01L 27/14689
See application file for complete search history.

(56) References Cited

U.S. PATENT DOCUMENTS

2015/0264233 A1\* 9/2015 Chien .................. H04N 5/2254
348/374

\* cited by examiner

*Primary Examiner* — Changhyun Yi
(74) *Attorney, Agent, or Firm* — McClure, Qualey & Rodack, LLP

(57) ABSTRACT

The image sensing device includes a pixel region in a pixel array area and a dummy pixel region in a periphery area. The pixel region includes a radiation region, a floating diffusion region, a transfer transistor, a source-follower transistor, a reset transistor and a select transistor. The dummy pixel region includes a radiation region and a floating diffusion region. A gate of one of the transfer transistor, the reset transistor and the select transistor in the pixel region is electrically connected to the radiation region or the floating diffusion region in the dummy pixel region.

20 Claims, 18 Drawing Sheets

IMAGE SENSING DEVICE AND MANUFACTURING METHOD THEREOF

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are developed.

Along with the advantages gained from reducing geometric size, improvements are being made directly to the IC devices. One such IC device is an image-sensor device. An image-sensor device includes a pixel array (or grid) for detecting light and recording intensity (brightness) of the detected light. For example, the pixel array responds to the light by accumulating a charge. The higher the intensity of the light is, the higher the charge is accumulated in the pixel array. The accumulated charge is used (for example, by other circuitry) to provide image information for use in a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Some variations of illustrative embodiments are described. Throughout the various views and the illustrative embodiments, like reference numbers are used to designate like elements.

In some image sensing devices provided in the disclosure, elements in a dummy pixel region of a periphery area are taken as a protection means for a pixel region of a pixel array area. To be specific, doped regions in the dummy pixel region act as diodes which are taken as voltage regulators for protecting gates of the transistors in the pixel region.

Figure 1:
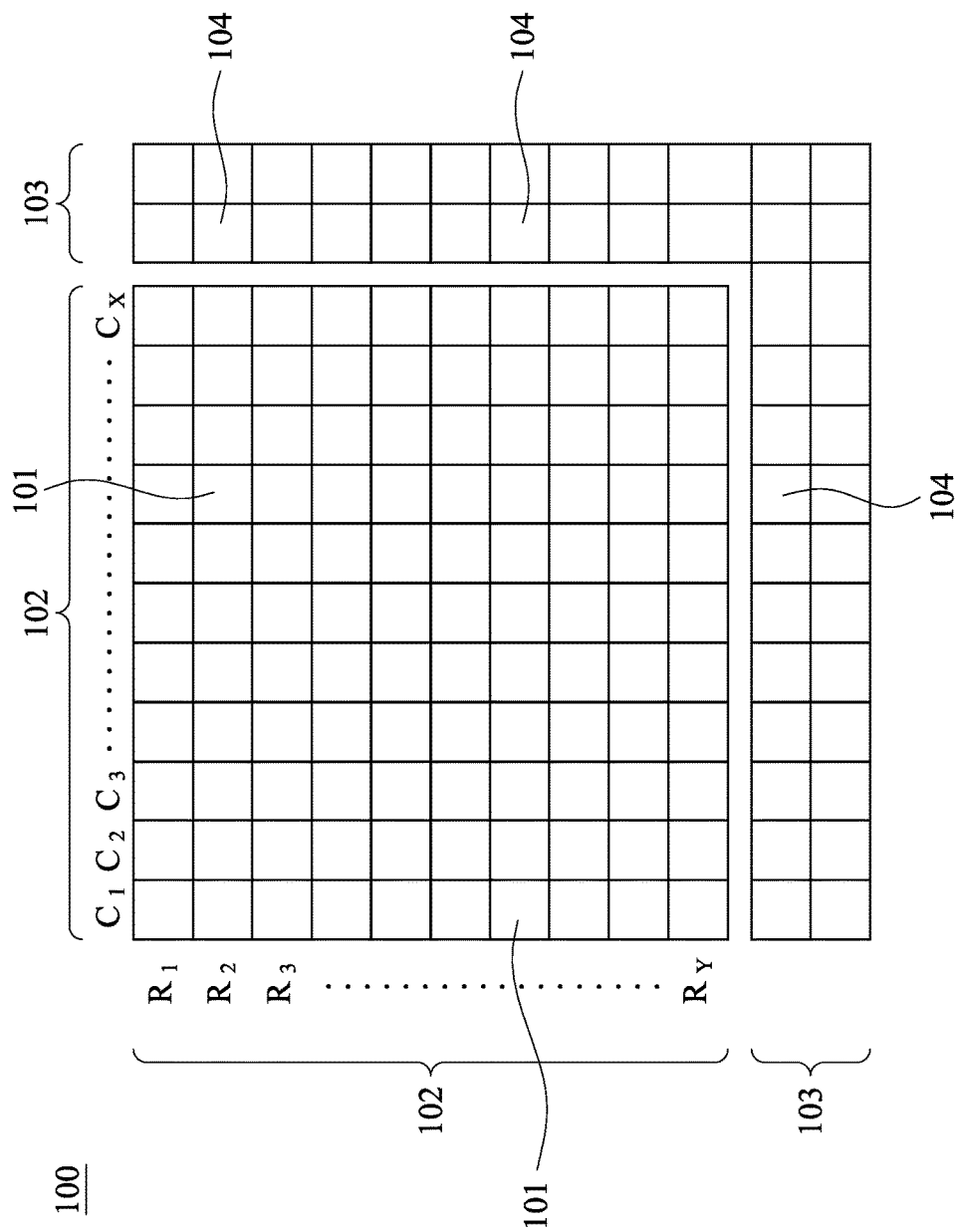
FIG. 1 is a schematic top view of an image sensing device in accordance with some embodiments.

FIG. 1 is a schematic top view of an image sensing device 100, in accordance with some embodiments. In some embodiments, the image sensing device 100 includes a front side illuminated (FSI) image sensing device. In some embodiments, the image sensing device 100 includes a backside illuminated (BSI) image sensing device, an FSI image sensing device, or a combination thereof.

The image sensing device 100 includes a pixel array area 102 and a periphery area 103. In the embodiment of FIG. 1, the periphery area 103 is disposed on the right and button of the pixel array area 102. However, it is appreciated that FIG. 1 is just an example, and the pixel array area 102 may be surrounded by the periphery area 103 in some embodiments. The pixel array area 102 includes an array of pixel regions 101. For example, the pixel regions 101 are arranged into columns $C_1$-$C_x$ and rows $R_1$-$R_y$. The term "pixel region" refers to a unit cell containing features such as a photodetector and various circuits. The unit cell may include various semiconductor features for converting electromagnetic radiation into an electrical signal. The photodetectors in the pixel regions 101 may include photodiodes, complimentary metal-oxide-semiconductor (CMOS) image sensors, charged coupling device (CCD) sensors, active sensors, passive sensors, other applicable sensors, or a combination thereof. On the other hand, the peripheral area 103 includes additional circuitry, inputs, and/or outputs which may be coupled to the pixel regions 101 in some embodiments. In the embodiment of FIG. 1, the periphery area 103 includes several dummy pixel regions 104 which may contain features similar with that in the pixel regions. However, the dummy pixel regions 104 are not used for sensing electromagnetic radiation. Some of the dummy pixel regions 104 and the pixel regions 101 are arranged in the same column or in the same row.

In some embodiments, the pixel regions 101 are designed to have various sensor types. One group of pixel regions 101 may be CMOS image sensors, and another group of pixel regions 101 may be another type of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Figure 2:
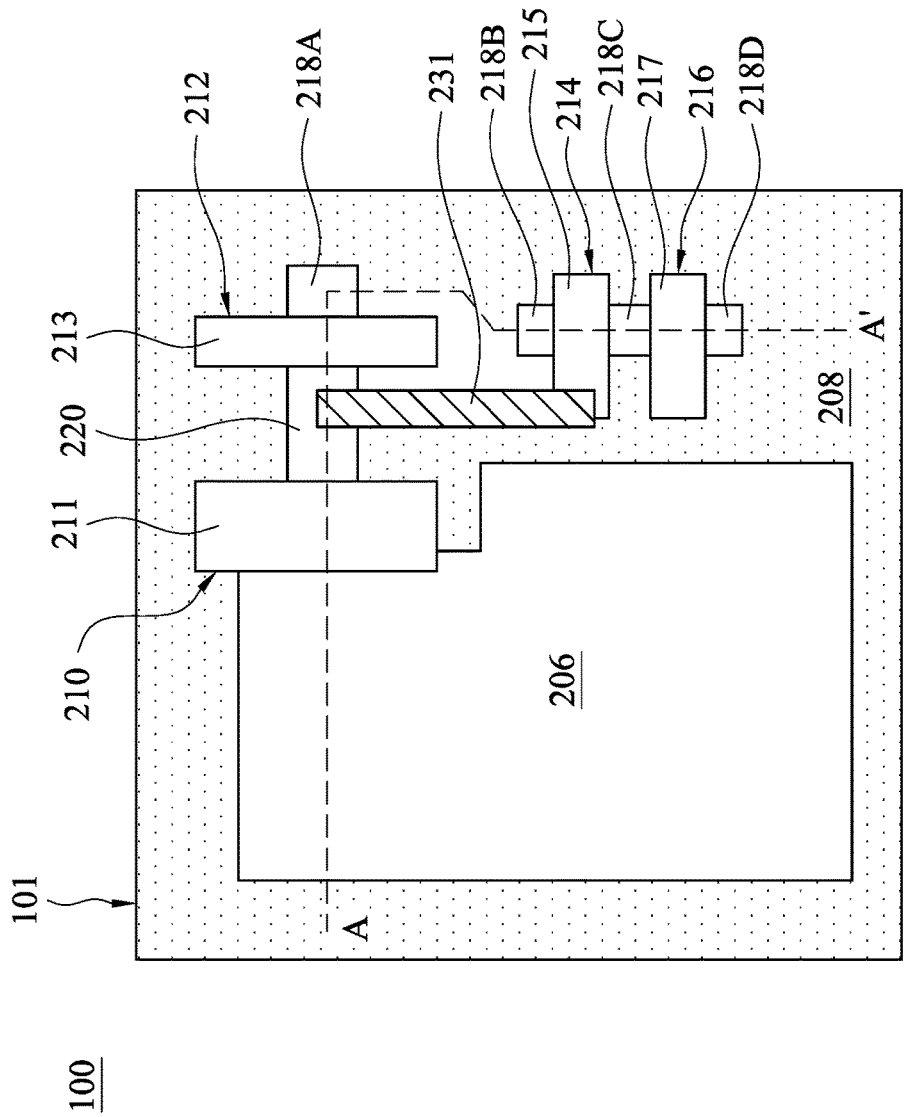
FIG. 2 is a schematic top view of one of pixel regions in accordance with some embodiments.
Figure 3:
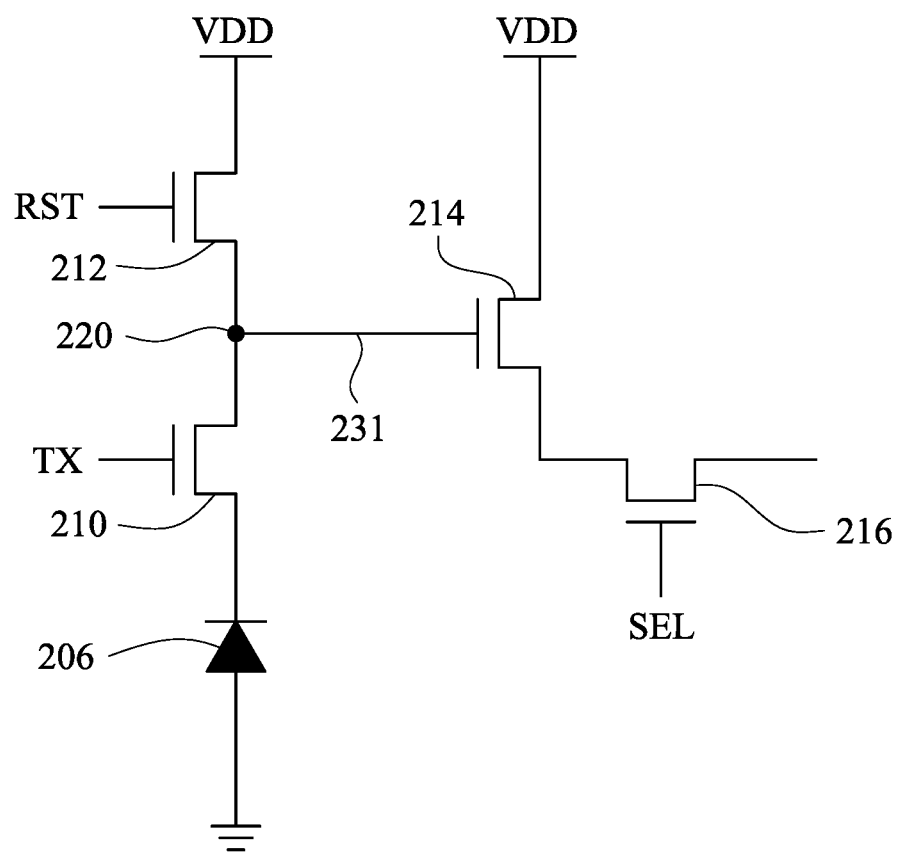
FIG. 3 is a schematic circuit diagram of one of the pixel region in accordance with some embodiments.

FIG. 2 is a schematic top view of one of the pixel regions 101, in accordance with some embodiments. FIG. 3 is a schematic circuit diagram of one of the pixel regions 101, in accordance with some embodiments. Referring to FIG. 2 and FIG. 3, the pixel region 101 includes a radiation region 206. The radiation region 206 may be a photodetector. In some embodiments, the radiation region 206 includes a photodiode (as shown in FIG. 3) for recording intensity or brightness of radiation.

The pixel region 101 contains various transistors. In some embodiments, the transistors include a transfer transistor 210, a reset transistor 212, a source-follower transistor 214, a select transistor 216, other suitable transistors, or a combination thereof. In some embodiments, one or some of the transistors mentioned above are not formed. In some other embodiments, one or more additional suitable devices such as transistors are further formed in the pixel region 101.

The pixel region 101 includes various doped regions formed in the semiconductor substrate, such as doped regions 218A-218D and 220. The doped regions 218A-218D and 220 serve as source/drain of the previously mentioned transistors. The doped region 220 is also referred to as a floating diffusion region in some embodiments. The doped region 220 is one of the source/drain for the transfer transistor 210 and the reset transistor 212. The doped region 218A is one of the source/drain for the reset transistor 212. The doped regions 218B and 218C are source/drain for the source-follower transistor 214. The doped regions 218C and 218D are source/drain for the select transistor 216.

The transfer transistor 210 includes a gate 211 over a channel region between the doped region 220 and the radiation region 206, in accordance with some embodiments. The reset transistor 212 includes a gate 213 over a channel region between the doped regions 220 and 218A. The source-follower transistor 214 includes a gate 215 over a channel region between the doped regions 218B and 218C. The select transistor 216 includes a gate 217 over a channel region between the doped regions 218C and 218D. In some embodiments, a conductive feature 231 overlaps a portion of the gate 215 of the source-follower transistor 214 and connects to the doped region 220. In other words, the doped region 220 is electrically connected to the gate 215 of the source-follower transistor 214. The isolation structure 208 is formed in the pixel region 101 to isolate devices or doped regions formed in the semiconductor substrate.

The image sensing device 100 further includes a color filter (not shown) and a lens (not shown) positioned over a front surface or a back surface of the semiconductor substrate in some embodiments. The color filter and the lens are aligned with the radiation region 206. In the operation of the image sensing device 100 according to some embodiments, the image sensing device 100 is designed to receive radiation traveling towards the front surface or the back surface of the semiconductor substrate. The incident radiation may be visual light. Alternatively, the incident radiation may be infrared (IR), ultraviolet (UV), X-ray, microwave, other suitable types of radiation, or a combination thereof. The lens positioned over the front surface or the back surface of the semiconductor substrate directs the incident radiation to the corresponding radiation region 206 in the semiconductor substrate. The incident radiation generates electron-hole pairs. When exposed to the incident radiation, the radiation region 206 responds to the incident radiation by accumulating electrons.

The transfer transistor 210 is controlled by a transfer signal TX. The reset transistor 212 is controlled by a reset signal RST. The select transistor 216 is controlled by a select signal SEL. The electrons are transferred from the radiation region 206 to the doped region 220 when the transfer transistor 210 is turned on. Through the connection of the conductive feature 231, the source-follower transistor 214 may convert the electrons from the doped region 220 to a voltage signal which is read by a circuit in the periphery area when the select transistor 216 is turned on. The reset transistor 212 may act as a switch to reset the doped region 220. When the reset transistor 212 is turned on, the doped region 220 is connected to a power supply VDD to clear all accumulated electrons.

Figure 4:
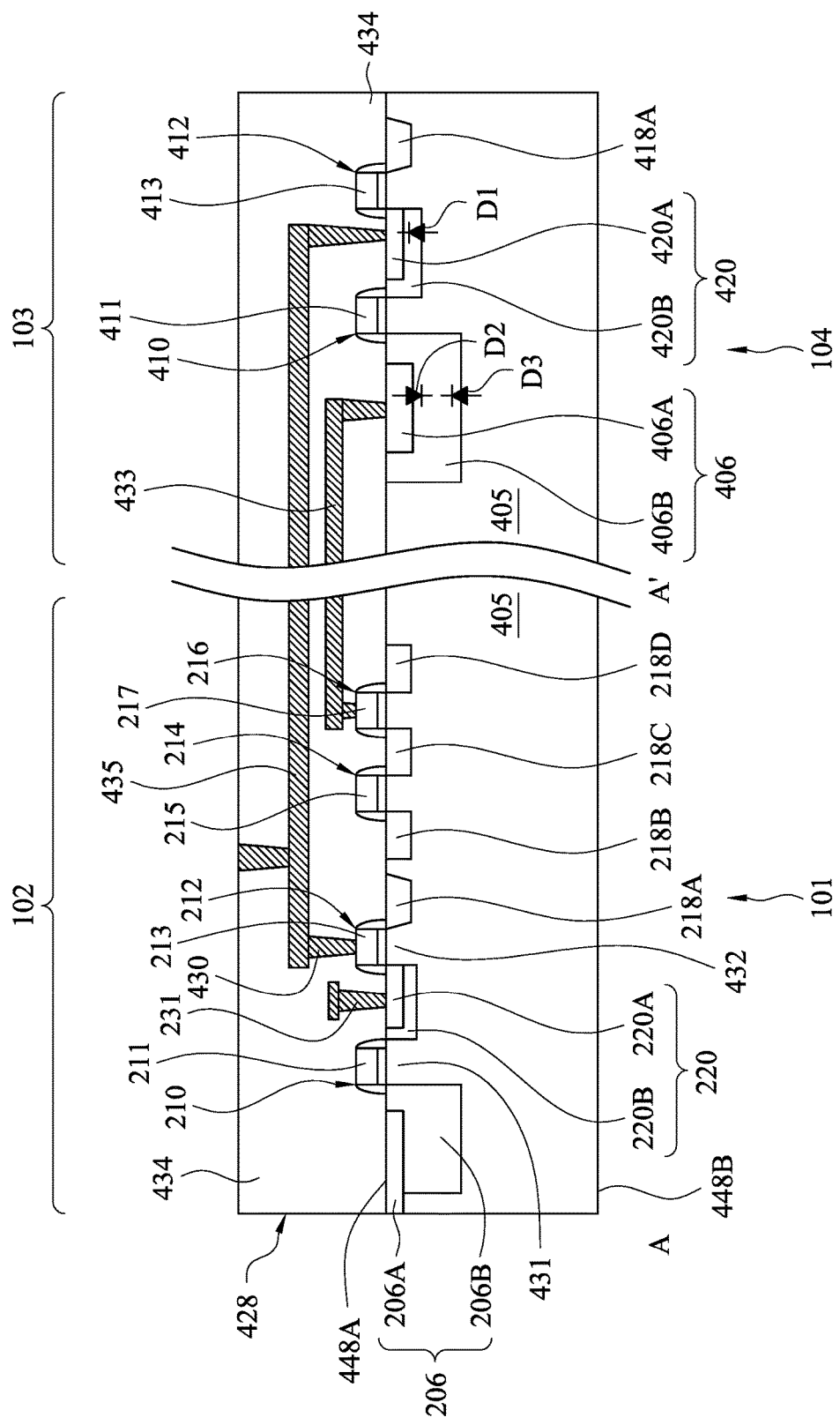
FIG. 4 is a schematic cross-sectional view of the pixel region of the image sensing device along a line A-A' in FIG. 2 with a dummy pixel region in accordance with some embodiments.

FIG. 4 is a schematic cross-sectional view of the pixel region of the image sensing device 100 along a line A-A' in FIG. 2 with a dummy pixel region, in accordance with some embodiments. The image sensing device 100 includes a semiconductor substrate 405 having a front surface 448A and a back surface 448B. In some embodiments, the semiconductor substrate 405 is a p-type doped substrate. P-type dopants, with which the semiconductor substrate 405 is doped, include boron, gallium, indium, other suitable p-type dopants, or a combination thereof. The semiconductor substrate 405 may alternatively be an n-type doped substrate. N-type dopants, with which the semiconductor substrate 405 is doped, include phosphorus, arsenic, other suitable n-type dopants, or a combination thereof. Doping may be implemented with a process such as ion implantation or diffusion, using various operations and techniques. In the following examples, a p-type doped substrate is taken as an example of the semiconductor substrate 405 for explanation.

In some embodiments, the radiation region 206 is a photodiode that includes a pinned layer 206A (also referred to a third pinned layer) and a pinned layer 206B (also referred to a fourth pinned layer). The pinned layer 206A is formed along the front surface 448A of the semiconductor substrate 405. A doping type of the pinned layer 206A is different from a doping type of the pinned layer 206B, and the doping type of the pinned layer 206B is different from a doping type of the semiconductor substrate 405. For example, the pinned layer 206A is a p-type doped region, the second pinned layer 206B is an n-type doped region, and the semiconductor substrate 405 is a p-type doped substrate. In some other embodiments, the pinned layer 206A is an n-type doped region, the second pinned layer 206B is a p-type doped region, and the semiconductor substrate 405 is an n-type doped substrate.

The doped region 220 (i.e. floating diffusion region) includes a doped region 220A and a doped region 220B. The doped region 220B is formed between the doped region 220A and the semiconductor substrate 405. The doping type of the doped region 220A is identical to the doping type of the doped region 220B with different doping concentration, and the doping type of the doped region 220B is different from the doping type of the semiconductor substrate 405. For example, the doped region 220A is an n-typed heavily doped region, the doped region 220B is an n-type lightly doped region, and the semiconductor substrate 405 is the p-type doped substrate.

The pixel region 101 includes various transistors, such as the transfer transistor 210, the reset transistor 212, the source-follower transistor 214, and the select transistor 216. Each transistor has a corresponding gate formed over the front surface 448A of the semiconductor substrate 405. For example, the transfer transistor 210 has the gate 211, the reset transistor 212 has the gate 213, the source-follower transistor 214 has the gate 215, and the select transistor 216 has the gate 217. The gate 211 may overlay a portion of the pinned layer 206B. The gate 211 may also cover a channel region 431 of the transfer transistor 210. The gate 213 may overlay a portion of the doped region 220 and a portion of the doped region 218A. The gate 213 may also cover a channel region 432 of the reset transistor 212.

The gate of each transistor includes a gate dielectric layer and a gate electrode layer. In some embodiments, the gate dielectric layer is made of a dielectric material, such as silicon oxide, a high-k dielectric material, other dielectric material, or combinations thereof. Examples of the high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, or a combination thereof. In some embodiments, the gate electrode layer includes polysilicon or metal materials. In some embodiments, the gate further includes sidewall spacers.

The dummy pixel region 104 has features similar with that in the pixel region 101. To be specific, the dummy pixel region 104 includes a radiation region 406, a transfer transistor 410, a floating diffusion region 420, a reset transistor 413 and a doped region 418A. Note that the dummy pixel region 104 may contain additional features such as transistors and doped regions in some embodiments. The transfer transistor 410 includes a gate 411 disposed between the radiation region 406 and the floating diffusion region 420. The reset transistor 412 includes a gate 413 disposed between the floating diffusion region 420 and the doped region 418A. The radiation region 406 includes a pinned layer 406A (also referred to a first pinned layer) and a pinned layer 406B (also referred to a second pinned layer). A doping type of the pinned layer 406A is different from a doping type of the pinned layer 406B, and the doping type of the pinned layer 406B is different from a doping type of the semiconductor substrate 405. For example, the pinned layer 406A is a p-type doped region, the pinned layer 406B is an n-type doped region, and the semiconductor substrate 405 is a p-typed doped substrate. The floating diffusion region 420 includes a doped region 420A (also referred to a first doped region) and a doped region 420B (also referred to a second doped region). The doped region 420B is formed between the doped region 420A and the semiconductor substrate 405. The doping type of the doped region 420A is identical to the doping type of the doped region 420B, the doping type of the doped region 420B is different from the doping type of the semiconductor substrate 405. For example, the doped region 420A is an n-typed heavily doped region, the doped region 420B is an n-type lightly doped region, and the semiconductor substrate 405 is a p-type doped substrate.

As shown in FIG. 4, the image sensing device 100 includes an interconnect structure 428 formed over the front surface 448A of the semiconductor substrate 405, in accordance with some embodiments. The interconnect structure 428 has various conductive features coupled to various components of the image sensing device 100, such as the floating diffusion region 220 and the transistors 210, 212 and 216. Therefore, the various components of the image sensing device 100 are operable to properly respond to illuminated light (imaging radiation).

In some embodiments, the interconnect structure 428 includes vertical conductive features 430, such as contacts and/or vias, and horizontal conductive features 435, such as lines. The various conductive features 430 and 435 are made of one or more conductive materials. In some embodiments, the conductive materials include aluminum, copper, titanium, titanium nitride, tungsten, polysilicon, metal silicide, other applicable materials, or a combination thereof. The interconnect structure 428 also includes an interlayer dielectric (ILD) structure 434, and the conductive features 430 and 435 are embedded in the ILD structure 434. In some embodiments, the ILD structure 434 includes silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof.

In the embodiment of FIG. 4, the gate 213 of the reset transistor 212 in the pixel region 101 is electrically connected to the floating diffusion region 420 in the dummy pixel region 104 through the conductive features 430 and 435. In addition, the gate 217 of the select transistor 216 is electrically connected to the radiation region 406 in the dummy pixel region 104 through a conductive feature 433. To be specific, the gate 213 is electrically connected to the doped region 420A, and the gate 217 is electrically connected to the pinned layer 406A. The doped region 420 and the semiconductor substrate 405 forms a diode D1. The pinned layer 406A and the pinned layer 406B forms a diode D2. The pinned layer 406B and the semiconductor substrate 405 forms a diode D3. Accordingly, referring to FIG. 5, the diode D1 is taken as a voltage regulator for protecting the reset transistor 212. The diodes D2 and D3 are back-to-back connected and are taken as a voltage regulator for protecting the select transistor 216.

Figure 5:
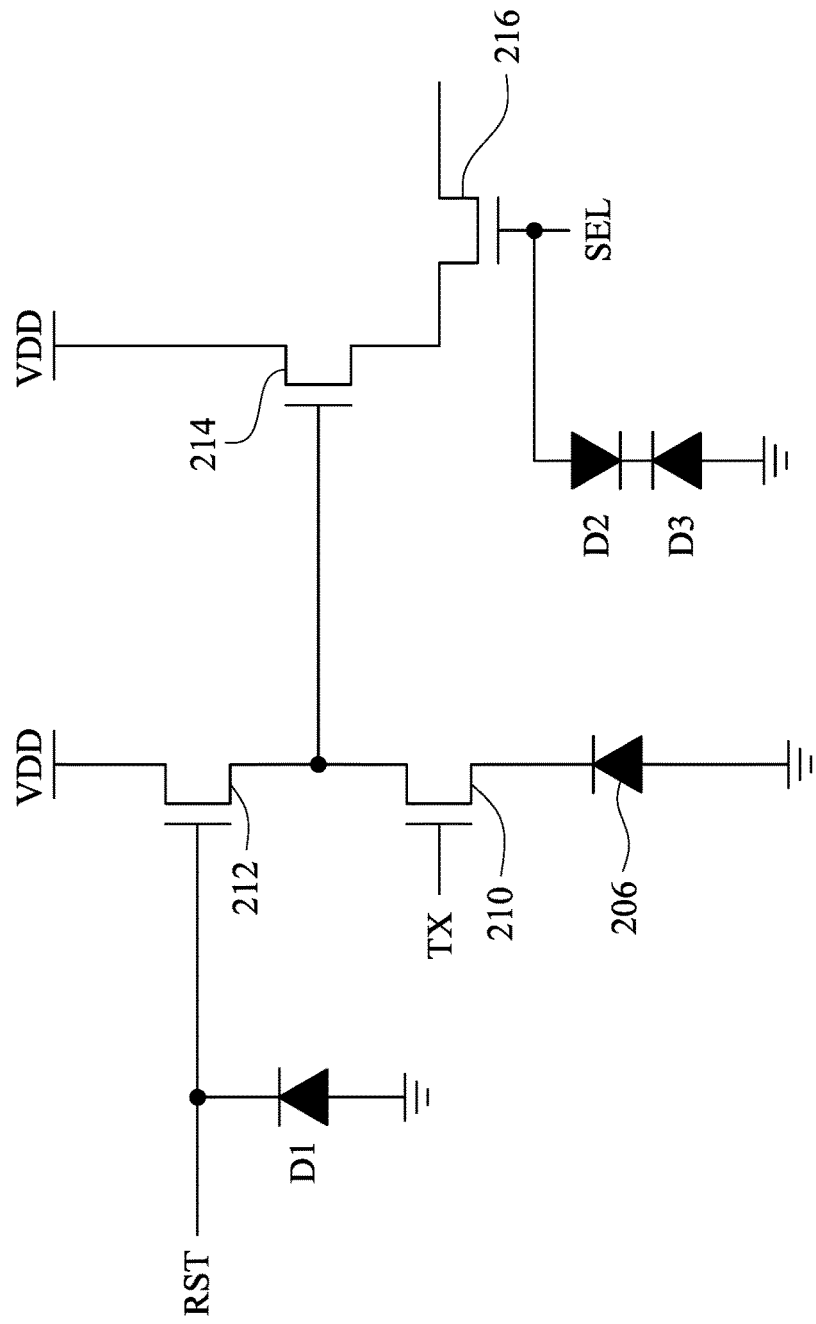
FIG. 5 is a schematic circuit diagram of one of the pixel regions with diodes in accordance with some embodiments.
Figure 6:
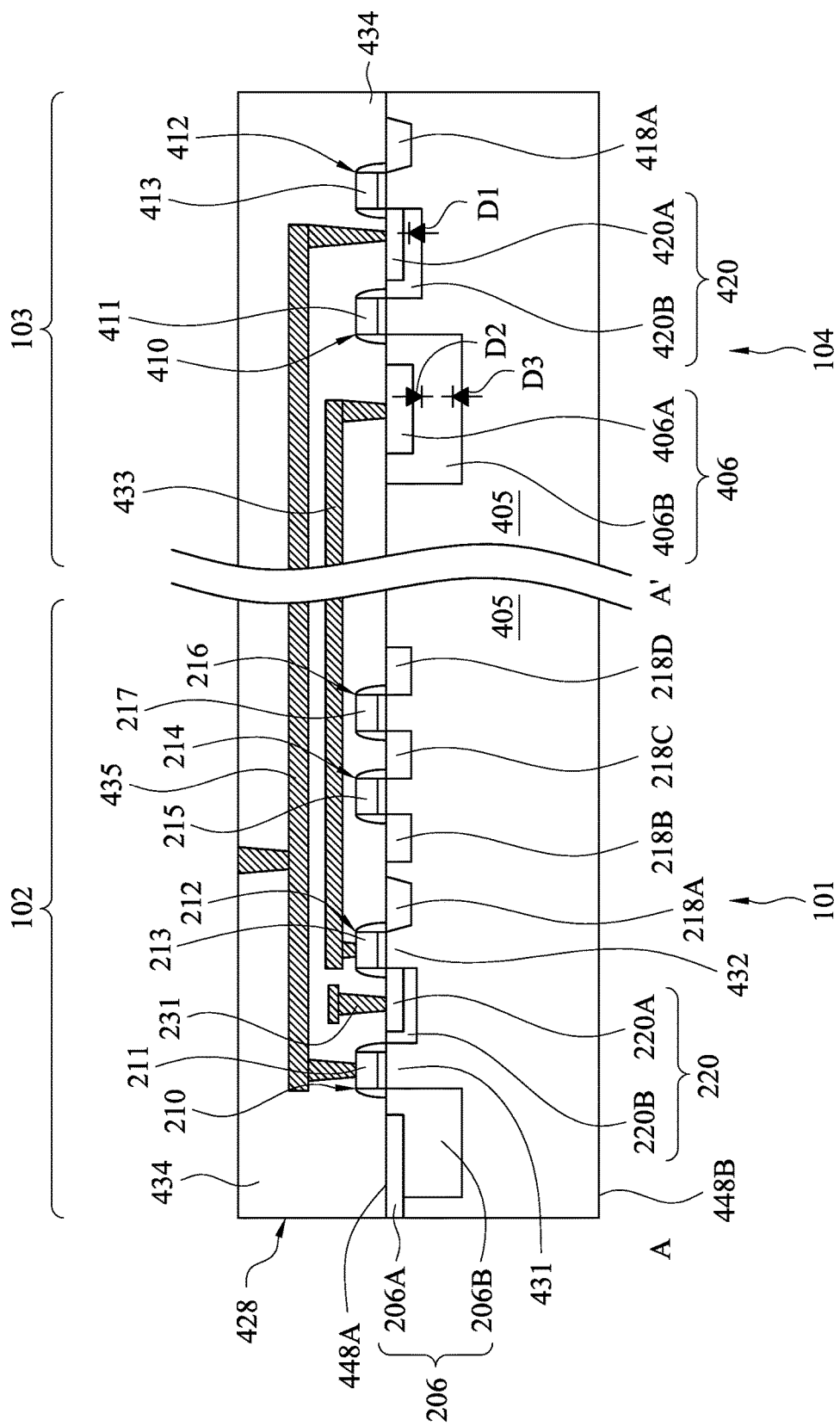
FIG. 6 is a schematic cross-sectional view of the pixel region of the image sensing device in accordance with some embodiments.

The radiation region 406 and the floating diffusion region 420 are electrically connected to the gates 213 and 217 respectively in the embodiment of FIGS. 4 and 5. However, the present disclosure is not limited thereto. In some embodiments, one gate of the transfer transistor 210, the reset transistor 214 and the select transistor 216 in the pixel region 101 is electrically connected to one of the radiation region 406 and the floating diffusion region 420 in the dummy pixel region 104, and/or another gate of the transfer transistor 210, the reset transistor 214 and the select transistor 216 in the pixel region 101 is electrically connected to the other one of the radiation region 406 and the floating diffusion region 420 in the dummy pixel region 104. For example, referring to FIG. 6, the gate 211 of the transfer transistor 210 is electrically connected to the floating diffusion region 420, and the gate 213 of the reset transistor 212 is electrically connected to the radiation region 406. It is appreciated that there are at least 6+2=8 different combinations of the electrical connections, and not all of them are illustrated in the figures for the sake of simplification.

Figure 7A:
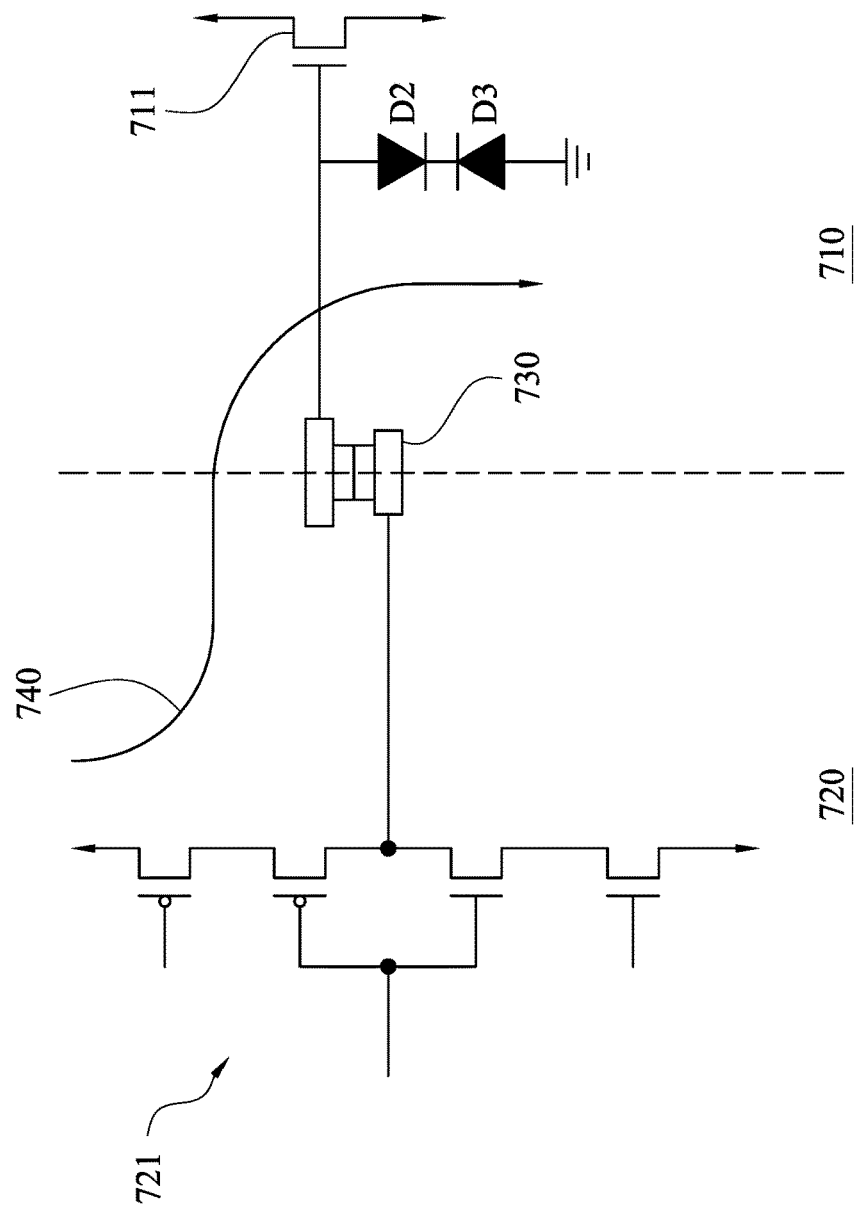
FIG. 7A and FIG. 7B are schematic diagrams illustrating wafer bonding according to some embodiments.

FIG. 7A is a schematic diagram illustrating wafer bonding according to some embodiments. Referring to FIG. 4 and FIG. 7A, the semiconductor substrate 405 is within a first wafer 710. The first wafer 710 includes a transistor 711 which may be the transfer transistor 210, the reset transistor 212 or the select transistor 216 in the pixel region 101. A second wafer 720 includes a circuit 721 which is an inverter in the embodiment of FIG. 7A. The second wafer 720 is bonded to the first wafer 710, and the circuit 721 is electrically connected to the gate of the transistor 711 through an interconnect structure 730. Note that during or after the bonding process, a current 740 may be generated due to factors such as a plasma process (referred to Plasma Charging Damage). However, the current 740 would flow through the diodes D2 and D3 instead of the gate of the transistor 711 so that the transistor 711 would not be damaged. In some embodiments, the voltage on the gate of the transistor 711 may be high due to some factors before the wafer bonding, but the damage to the transistor 711 is avoided due to the configuration of the diodes D2 and D3. Note that the diodes D2 and D3 may be replaced with the diode D1 which provides similar advantages.

In some embodiments, the semiconductor substrate 405 in the periphery area 103 is electrically connected to the ground voltage so that the current 740 would flow into the ground through the diodes D2 and D3. However, in other embodiments, the semiconductor substrate 405 in the periphery area 103 may be electrically connected to the power supply VDD so that the current 740 would flow into the power supply VDD through the diodes D2 and D3.

Figure 7B:
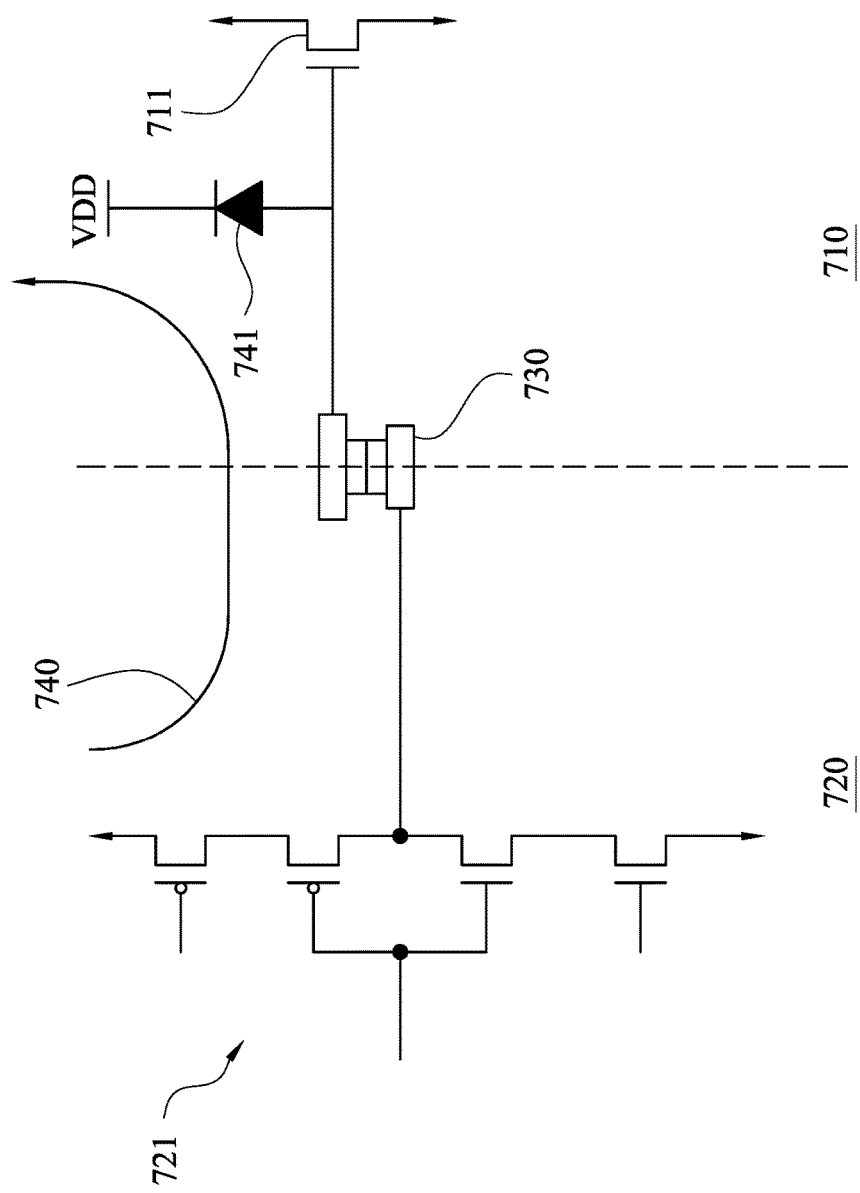

Referring to FIG. 7B, in the embodiment of FIG. 7B, the transistor 711 is protected by a diode 741. The voltage applied to the gate of the transistor 711 is generally lower than the power supply VDD, resulting in that the diode 741 is reverse biased in normal operation. When the voltage on the gate of the transistor 711 is raised due to factors such as Plasma Charging Damage, the current 740 would flow into the power supply VDD through the diode 741. The diode 741 may be realized by connecting the gate of the transistor 711 to a P-type doping region (i.e. the anode of the diode 741) in the periphery area and connecting an N-type doping region (i.e. the cathode of the diode 741) to the power supply VDD. For example, referring to FIG. 6 and FIG. 7B, the diode 741 may be realized by the diode D2 by connecting the pinned layer 406B to the power supply VDD. However, in other embodiments, the diode 741 may be realized by any other P-type doping region and N-type doping region in the periphery area.

Referring to FIG. 4 again, note that the pinned layer 406A is completely surrounded by the pinned layer 406B under the front surface 448A of the semiconductor 405, but the pinned layer 206A is partially surrounded by the pinned layer 206B under the front surface 448A of the semiconductor 405. The configuration of the complete surrounding is to prevent the pinned layer 406A from being directly connected to the semiconductor substrate 405. If the pinned layer 406A is directly connected to the semiconductor substrate 405, then a current may occur from the pinned layer 406A to the semiconductor 405 when the select signal SEL is applied to the gate 217 of the select transistor 216, and thus the select transistor 216 may not operate appropriately, and/or the voltage regulator composed of the diodes D2 and D3 may not function appropriately.

Figure 8:
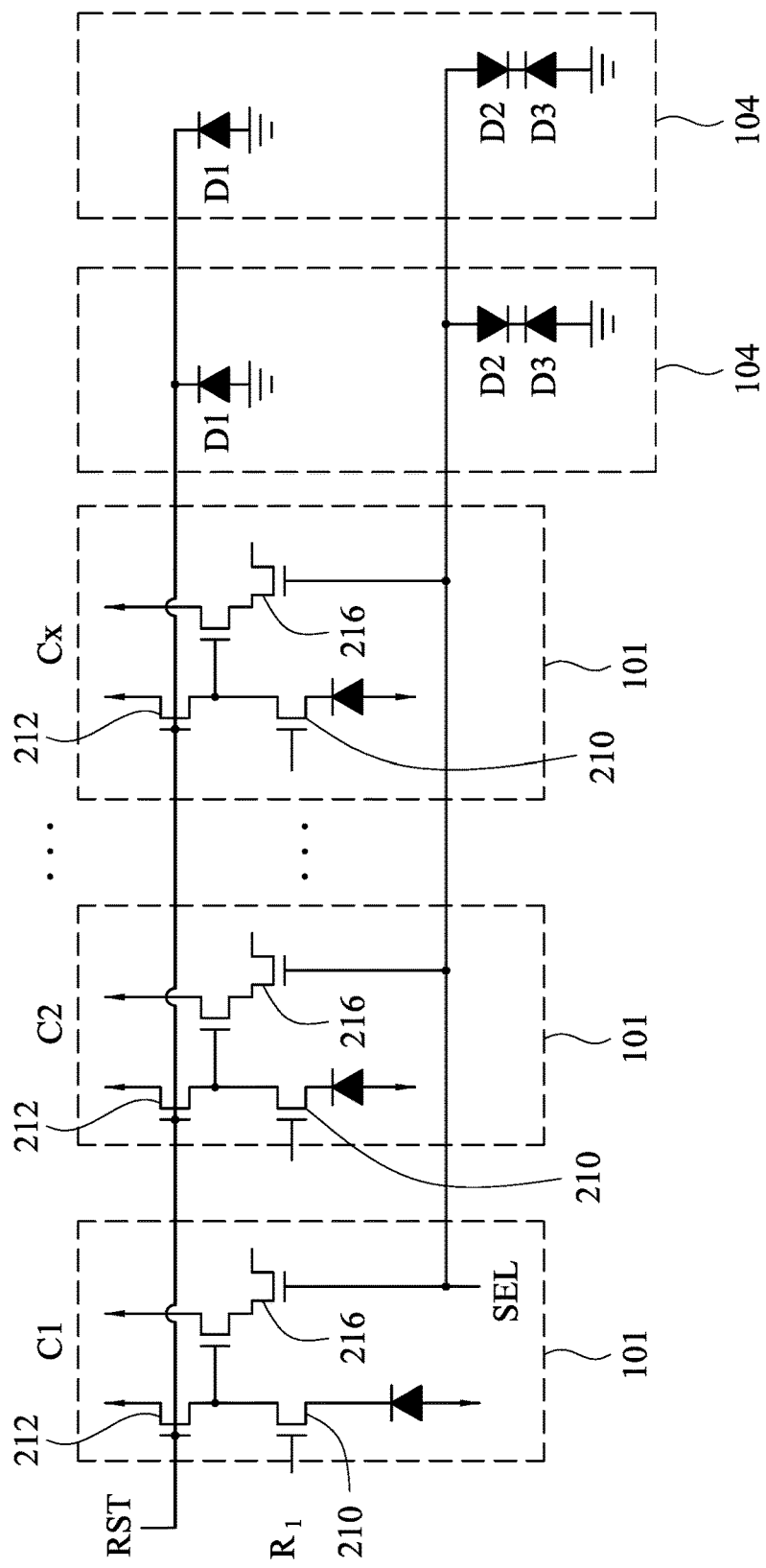
FIG. 8 is a schematic circuit diagram illustrating the coupling between the pixel regions and the dummy pixel region according to some embodiments.

FIG. 8 is a circuit diagram illustrating the coupling between the pixel regions and the dummy pixel region according to some embodiments. In the embodiments of FIG. 8, the pixel regions 101 and the dummy pixel regions 104 are arranged in the same row $R_1$. All the reset transistors 212 in the same row $R_1$ are turned on/off by the same reset signal RST, and all the select transistors 216 in the row $R_1$ are turned on/off by the same select signal SEL, in accordance with some embodiments. Therefore, more than one pixel regions may share one or more dummy pixel regions. To be specific, referring to FIG. 4 and FIG. 8, each gate 213 of the reset transistors 212 in the pixel regions 210 of the columns $C_1$ to $C_x$ is electrically connected to the diodes D1 (i.e. the floating diffusion region 420) in the two dummy pixel regions 104. In addition, each gate 217 of the select transistors 216 in the pixel regions 210 of the columns $C_1$ to $C_x$ is electrically connected to the diodes D2 and D3 (i.e. the radiation region 406) in the two dummy pixel regions 104. As mentioned above, there may be some other combinations of the electrical connections. In some embodiments, each gate 213 of the reset transistors 212 in the pixel regions 210 of the columns $C_1$ to $C_x$ is electrically connected to the diodes D2 and D3 in the two dummy pixel regions 104; and each gate 217 of the select transistors 216 in the pixel regions 210 of the columns $C_1$ to $C_x$ is electrically connected to the diodes D1 in the two dummy pixel regions 104. In some embodiments, the gates of the transfer transistors 210 may be electrically connected to different dummy pixel regions.

Figure 9A:
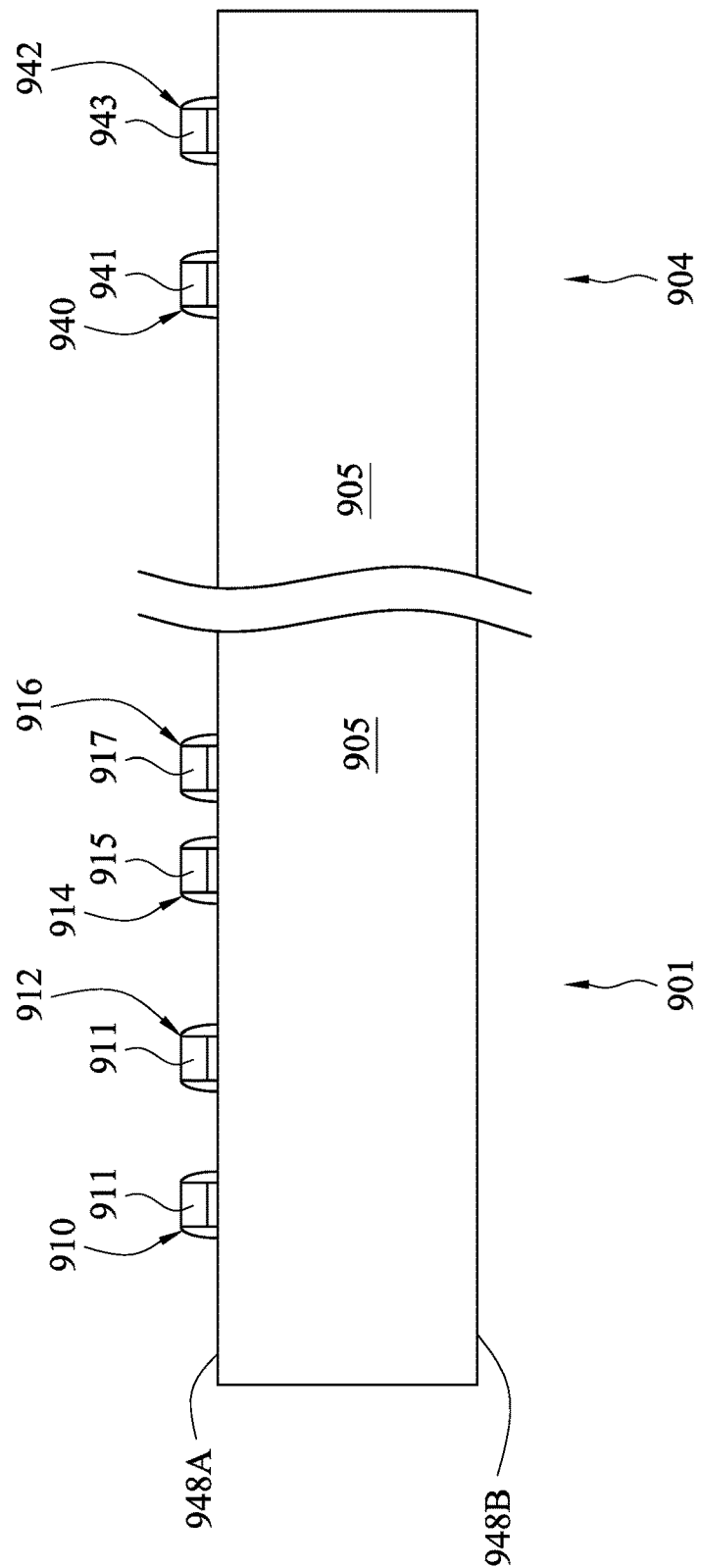
FIG. 9A to FIG. 9D are diagrams illustrating intermediate stages of manufacturing an image sensing device in accordance with some embodiments.

FIG. 9A to FIG. 9D are diagrams illustrating intermediate stages of manufacturing an image sensing device in accordance with some embodiments. Referring to FIG. 9A, a semiconductor substrate 905 is provided. The semiconductor substrate 905 has a pixel region 901 and a dummy pixel region 904. The semiconductor substrate 905 has a front surface 948A and a back surface 948B. In some embodiments, the semiconductor substrate 905 is a p-type doped substrate. P-type dopants, with which the semiconductor substrate 905 is doped, include boron, gallium, indium, other suitable p-type dopants, or a combination thereof. The semiconductor substrate 905 may alternatively be an n-type doped substrate. N-type dopants, with which the semiconductor substrate 905 is doped, include phosphorus, arsenic, other suitable n-type dopants, or a combination thereof. Doping may be implemented with a process such as ion implantation or diffusion, using various operations and techniques. In the following examples, a p-type doped substrate is taken as an example of the semiconductor substrate 905 for explanation.

Gates 911, 913, 915, and 917 are formed on the semiconductor substrate 905 in the pixel region 901. Gates 941 and 943 are formed on the semiconductor substrate 905 in the dummy pixel region 904. Each of the gates 911, 913, 915, 917, 941 and 943 includes a gate dielectric layer and a gate electrode layer. In detail, the gate dielectric layer is first formed. In some embodiments, the gate dielectric layer is $SiO_2$. Other dielectrics can also be used. In an alternative embodiment, the gate dielectric layer is a high-k dielectric which may include hafnium-based materials such as $HfO_2$, HfSiO, HfSiON, HfTaO, HfTiO, HfZrO, and $HfO_2$—$Al_2O_3$ alloy. Additional examples of the high-k dielectrics include, without limitation, $ZrO_2$, $Ta_2O_5$, $Al_2O_3$, $Y_2O_3$, $La_2O_3$, and $SrTiO_3$. Then, the gate electrode layer is formed on the dielectric layer. The gate electrode layer is polysilicon in some embodiments. Other conductors can be used instead. The gate electrode layer may also be made up of multiple layers of various materials. In some alternative embodiment, the gate electrode layer is one or more metal layers. The metal layers generally include at least one layer of Ti, TiN, TaN, Ta, TaC, TaSiN, W, WN, MoN, and MoON. Additional examples of materials for conductive metal layers include ruthenium, palladium, platinum, cobalt, nickel, hafnium, zirconium, titanium, tantalum, aluminum, and conductive carbides, oxides, and alloys of these metals. Then, a hard mask layer (not shown in FIG. 9A) is formed. The hard mask layer may include one or more layers such as silicon nitride layer and/or silicon dioxide layer. Other hard mask materials can be used instead. Then, a photolithography or any other suitable process is performed, and one or more etch processes are performed. The etch processes, for example, include a dry etch process to etch through the gate electrode layer and a wet etch process to etch through the gate dielectric layer. In some embodiments, sidewall spacers are formed after the dry etch process but before the wet etch process. Forming the sidewall spacers includes filling vias caused by the dry etch process with spacer material and then anisotropically etching to remove the spacer material from all but the sidewalls of the vias. Forming the sidewall spacers prior to the wet etch process allows the spacers to protect the gates from damage during the subsequent wet etch process. The wet etch process removes the hard mask layer on top of the gates while extending the vias through the gate dielectric layer, producing the structure shown in FIG. 9A.

Figure 9B:
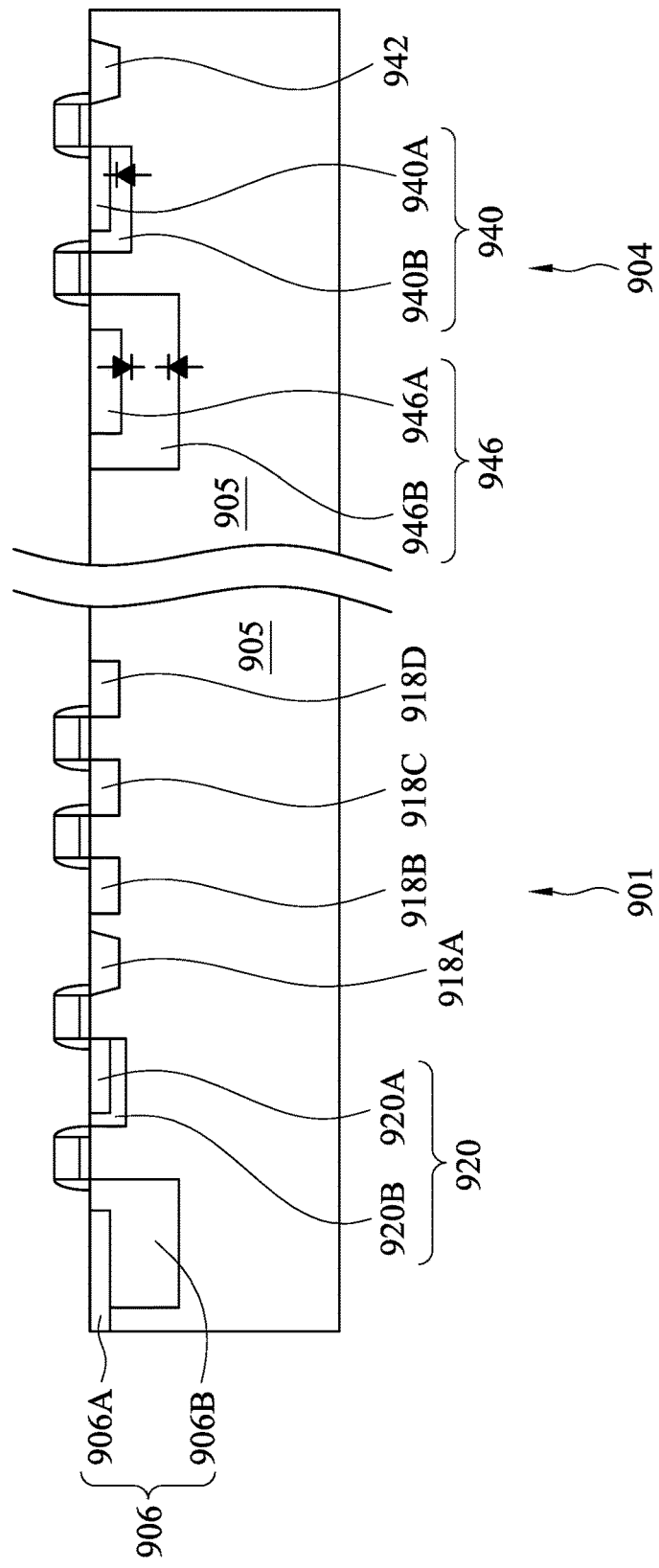

Referring to FIG. 9B, a radiation region 906, a floating diffusion region 920, and doped regions 918A-918D are formed in the pixel region 901. In addition, a radiation region 946, a floating diffusion region 940 and a doped region 942 are formed in the dummy pixel region 904. The radiation region 906 includes a pinned layer 906A and a pinned layer 906B. The floating diffusion region 920 includes a doped region 920A and a doped region 920B. The radiation region 946 includes a pinned layer 946A and a pinned layer 946B. The floating diffusion region 940 includes a doped region 940A and a doped region 940B. In detail, the pinned layer 906B, the doped regions 920B, 918A-918C, the pinned layer 946B, the doped region 940B, and the doped region 942 are first formed in the semiconductor substrate 405 in one or more ion implantation or diffusion processes. Then, the pinned layer 906A is formed on the pinned layer 906B and is partially surrounded by the pinned layer 906B. The doped region 920A is formed in the doped region 920B. The pinned layer 946A is formed within the pinned layer 946B and is completely surrounded by the pinned layer 946B. The doped region 940A is formed in the doped region 940B. Note that the pinned layer 906A, and the doped regions 920A, 946A and 940B may be formed in several ion implantations or diffusion processes. A doping type of the pinned layer 906A is different from a doping type of the pinned layer 906B, and the doping type of the pinned layer 906B is different from a doping type of the semiconductor substrate 905. For example, the pinned layer 906A is a p-type doped region, the pinned layer 906B is an n-type doped region, and the semiconductor substrate 905 is a p-typed doped substrate. The doping type of the doped region 920A is identical to the doping type of the doped region 920B, and the doping type of the doped region 920B is different from the doping type of the semiconductor substrate 905. For example, the doped region 920A is an n-typed heavily doped region, the doped region 920B is an n-type lightly doped region, and the semiconductor substrate 905 is a p-type doped substrate. Similarly, a doping type of the pinned layer 946A is different from a doping type of the pinned layer 946B, and the doping type of the pinned layer 946B is different from a doping type of the semiconductor substrate 905. The doping type of the doped region 940A is identical to the doping type of the doped region 940B, and the doping type of the doped region 940B is different from the doping type of the semiconductor substrate 905.

Figure 9C:
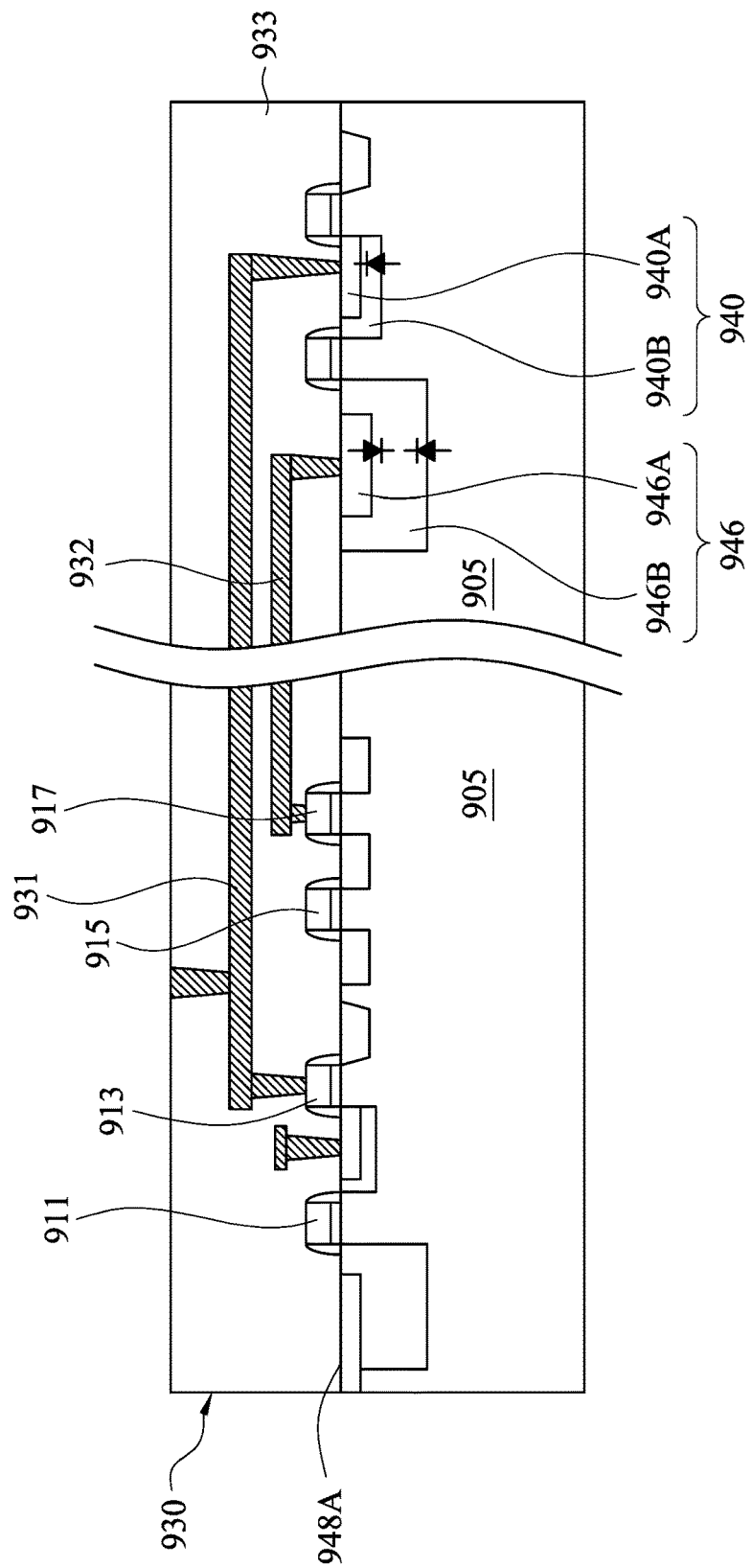

Referring to FIG. 9C, an interconnect structure 930 is formed over the front surface 948A of the semiconductor substrate 905. The interconnect structure 930 includes conductive features 931 and 932 which are made of one or more conductive materials such as aluminum, copper, titanium, titanium nitride, tungsten, polysilicon, metal silicide, other applicable materials, or a combination thereof. The interconnect structure 930 also includes an interlayer dielectric (ILD) structure 933, and the conductive features 931 and 932 are embedded in the ILD structure 933. In some embodiments, the ILD structure 933 includes silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. In the embodiment, the conductive feature 931 is formed for electrically connecting the gate 913 to the floating diffusion region 940, and the conductive feature 932 is formed for electrically connecting the gate 917 to the radiation region 946. Note that the FIG. 9C is an example, and other there may be other combinations of electrical connections. In some embodiments, one of the gates 911, 913 and 917 is electrically connected to one of the radiation region 946 and the floating diffusion region 940, and/or another one of the gates 911, 913 and 917 is electrically connected to the other one of the radiation region 946 and the floating diffusion region 940.

Figure 9D:
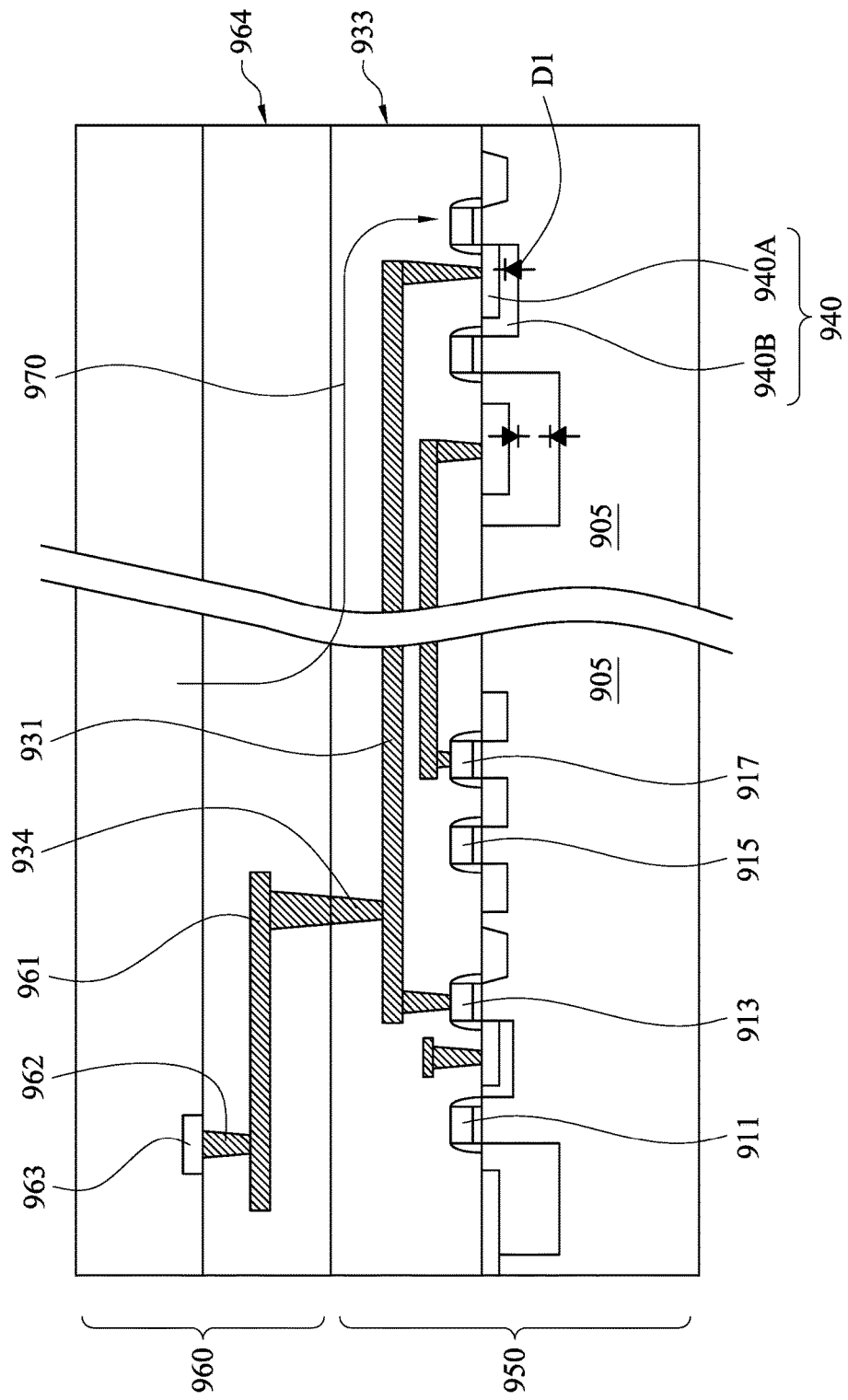

Referring to FIG. 9D, the semiconductor substrate 905 is within a wafer 950. A second wafer 960 is bonded to the first wafer 950. The second wafer 960 includes a interconnect structure 964 having conductive features 961 and 962. The second wafer 960 also includes a circuit 963 which is electrically connected to the gate 913 through the conductive features 962, 961, 934 and 931. Therefore, if a current 970 is generated (e.g. due to Plasma Charging Damage), then the current 970 would flow through the diodes D1 instead of gate 913. Note that circuit 721 may be electrically connected to the gates 911, 915 or 917 in some embodiments.

Figure 10:
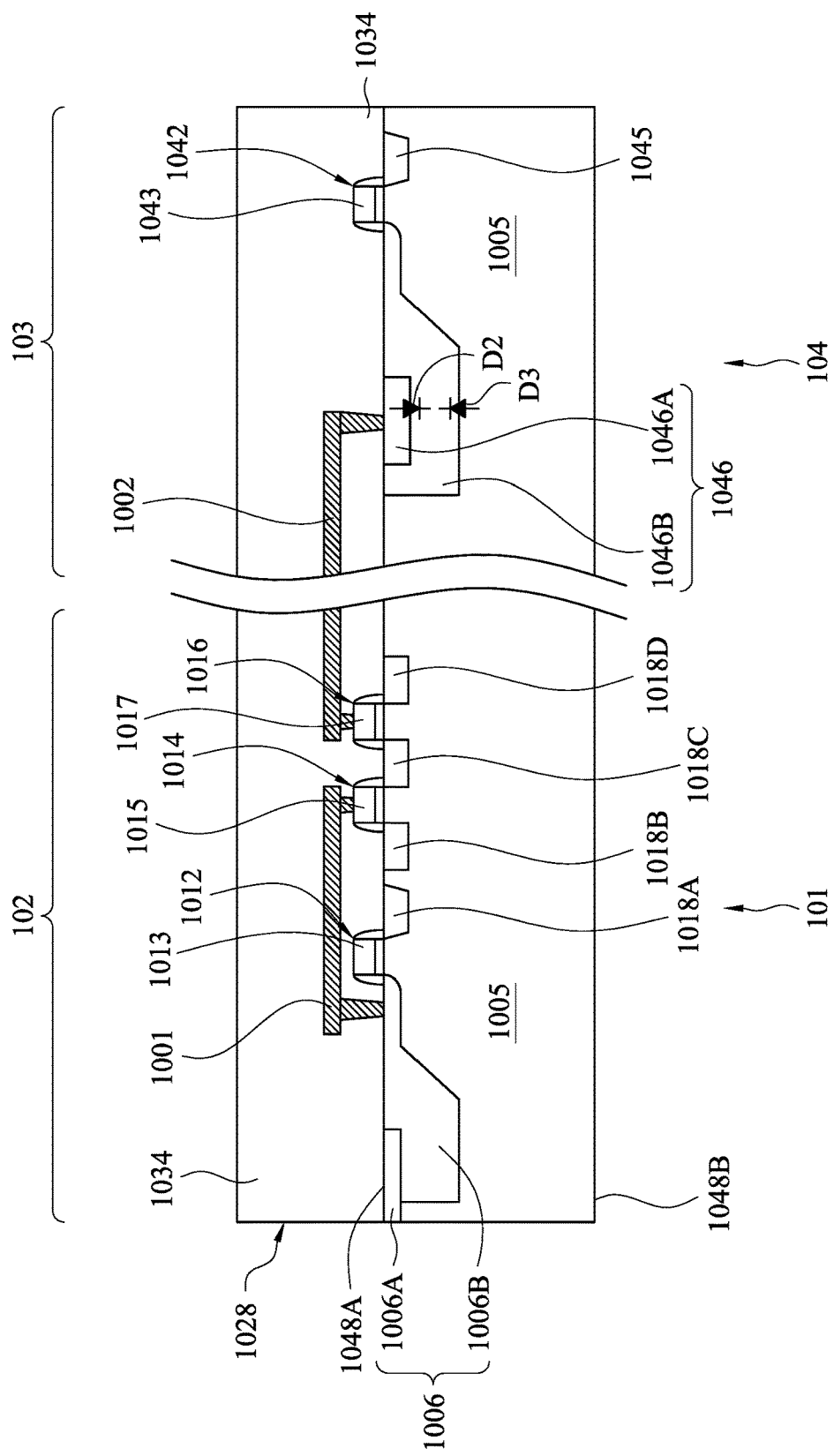
FIG. 10 is a schematic cross-sectional view of the pixel region of the image sensing device having 3T active pixel sensor (APS), in accordance with some embodiments.
Figure 11:
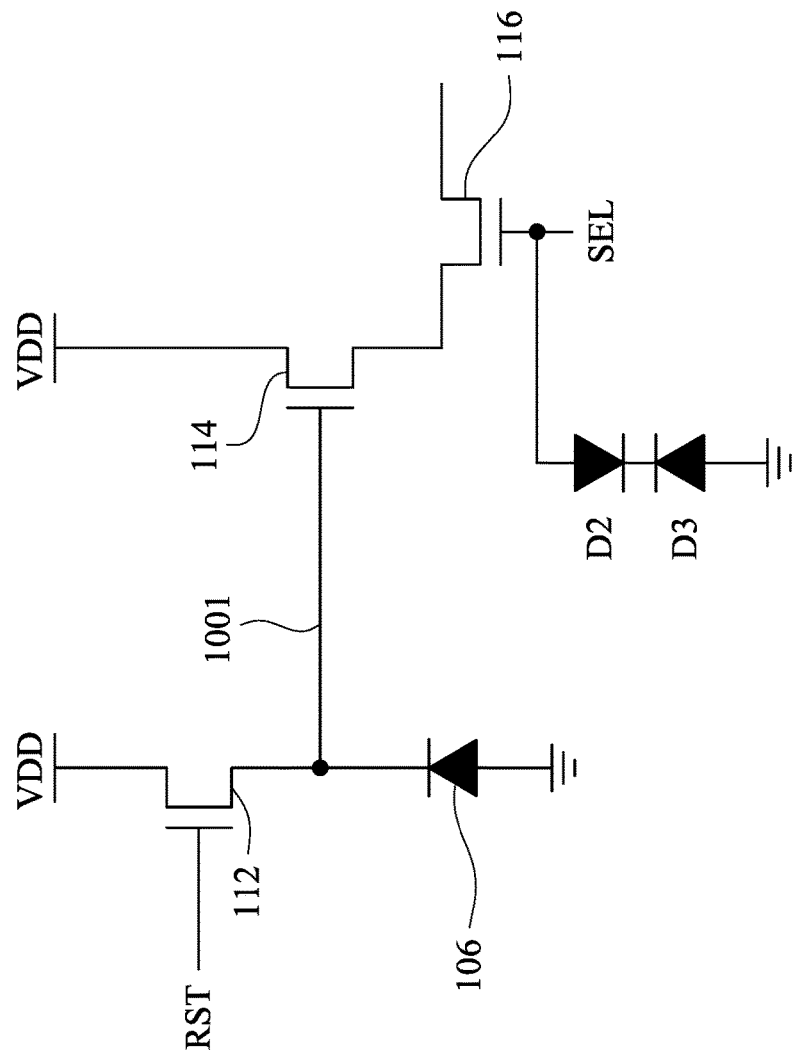
FIG. 11 is an active pixel sensor (APS) circuit diagram of the pixel region in FIG. 10, in accordance with some embodiments.

In the aforementioned embodiments, the pixel regions include 4T active pixel sensor (APS), but the pixel regions may include 3T APS in other embodiments. FIG. 10 is a cross-sectional view of the pixel region of the image sensing device 100 having 3T APS, in accordance with some embodiments. FIG. 11 is a circuit diagram of the pixel region 101 in FIG. 10, in accordance with some embodiments. Referring to FIG. 10 and FIG. 11, a semiconductor substrate 1005 has a front surface 1048A and a back surface 1048B. The pixel region 101 includes a reset transistor 1012, a source-follower transistor 1014, and a select transistor 1016. The pixel region 101 also includes a radiation region 1006, doped regions 1018A-1018D. The reset transistor 1012 includes a gate 1013 disposed between the radiation region 1006 and the doped region 1018A. The source-follower transistor 1014 includes a gate 1015 disposed between the doped regions 1018B and 1018C. The select transistor 1016 includes a gate 1017 disposed between the doped regions 1018C and 1018D. The source-follower transistor 1014 and the select transistor 1016 share the doped region 1018C as their source or drain. The radiation region 1006 is electrically connected to the gate 1015 through a conductive feature 1001. The dummy pixel region 104 includes a radiation region 1046, a reset transistor 1042 and a doped region 1045. The reset transistor 1042 includes a gate 1043 disposed between the radiation region 1046 and the doped region 1045. The radiation region 1046 is electrically connected to the gate 1017 through a conductive feature 1002. Note that the radiation region 1046 may be electrically connected to the gate 1013 in other embodiments.

The radiation region 1006 may be a photodetector. In some embodiments, the radiation region 1006 includes a photodiode (as shown in FIG. 11) for recording intensity or brightness of radiation. The radiation region includes a pinned layer 1046A and a pinned layer 1046B. The doping type of the pinned layer 1046A is different from that of the pinned layer 1046B, and the doping type of the pinned layer 1046B is different from that of the semiconductor substrate 1005. The gate 1013 or the gate 1017 may be electrically connected to the pinned layer 1046A. The pinned layer 1046A is formed along the front surface 1048A of the semiconductor substrate 1005, and the pinned layer 1046A is completely surrounded by the pinned layer 1046B under the front surface 1048A of the semiconductor substrate 1005. In contrast, a pinned layer 1006A in the pixel region 101 is formed along the front surface 1048A of the semiconductor substrate 1005, and the pinned layer 1006A is partially surrounded by the pinned layer 1006B under the front surface 1048A of the semiconductor substrate 1005. When more than one pixel regions 101 and the dummy pixel region 104 are arranged in the same row, the gate 1013 or 1017 in each of the pixel regions 101 may be electrically connected to the radiation region 1046 in the dummy pixel region 104. When more than one dummy pixel regions 104 and the pixel regions 101 are arranged in the same row, the gate 1013 or 1017 in each of the pixel regions 101 may be electrically connected to the radiation region 1046 in each of the dummy pixel regions 104. In addition, referring to FIG. 10 and FIG. 7A, the semiconductor substrate 1005 is within the first wafer 710, the second wafer 720 is bonded to the first wafer 710. The circuit 721 in the second wafer 720 is electrically connected to the gate 1013 or 1017 in the pixel region 101.

Figure 12:
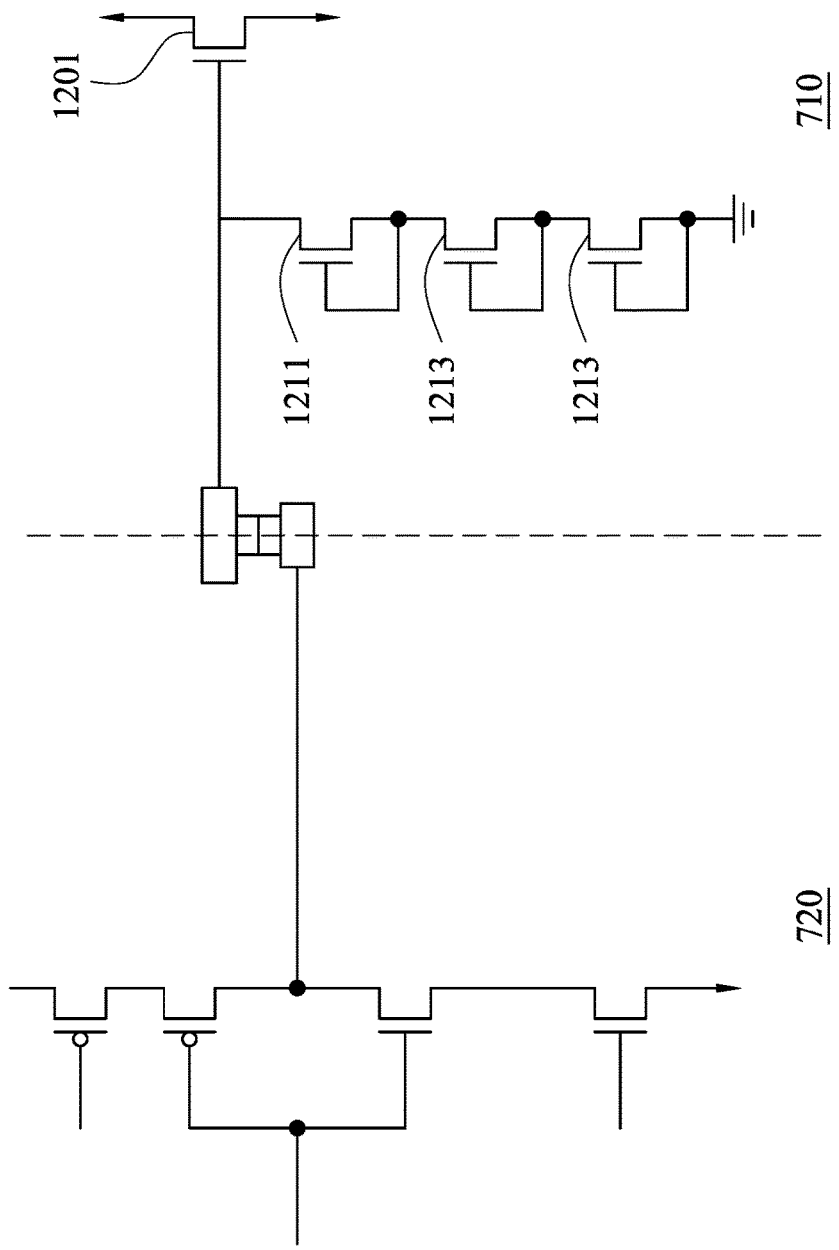
FIG. 12 is a diagram illustrating diode-connected transistors in accordance with some embodiments.

In some embodiments, the transistors in the periphery area 103 may be in the diode-connected model for protecting the transistors in the pixel array area 102. For example, FIG. 12 is a diagram illustrating diode-connected transistors in accordance with some embodiments. Referring to FIG. 12, a transistor 1201 in the first wafer 710 may be the transfer transistor, the reset transistor or the select transistor in one of the pixel regions 101. Transistors 1211-1213 are diode-connected transistors in the dummy pixel regions 104. That is, sources or drains of the transistors 1211-1213 are electrically connected to the respective gates. In some embodiments, the transistors 1211-1213 are three different transistors in one dummy pixel region 104. In some embodiments, the transistors 1211-1213 are three reset transistors (transfer transistors, source-follower transistors or select transistors) in three different dummy pixel regions 104. In the embodiment of FIG. 12, the gate of the transistor 1201 is electrically connected to three diode-connected transistors, but the gate of the transistor 1201 may be electrically connected to more or less diode-connected transistors which are in the same dummy pixel region or in different dummy pixel regions in some embodiments.

Figure 13:
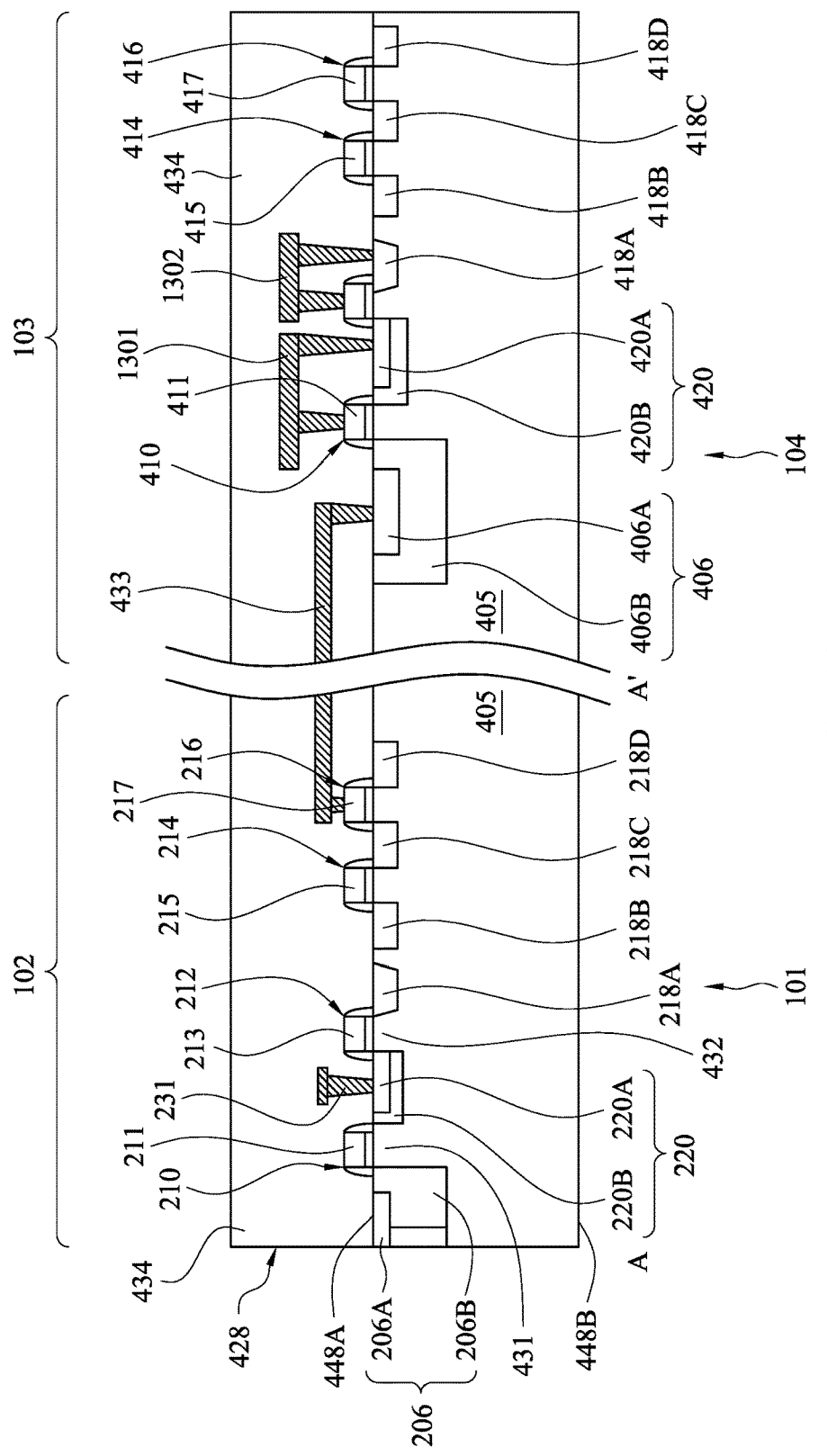
FIG. 13 is a schematic cross-sectional view of the pixel region and the dummy pixel region in accordance with some embodiments.

FIG. 13 is a schematic cross-sectional view of the pixel region and the dummy pixel region in accordance with some embodiments. Referring to FIG. 13, the dummy pixel region 104 includes the transfer transistor 410, the reset transistor 412, a source-follower transistor 414, a select transistor 416, and doped regions 418B-418D. At least one of the transfer transistor 410, the reset transistor 412, the source-follower transistor 414 and the select transistor 416 is in the diode-connected model and is electrically connected to the gate 211, the gate 213 or the gate 217. For example, in the embodiment of FIG. 13, the gate 217 of the select transistor 216 is electrically connected to the radiation region 406. In addition, the gate 411 of the transfer transistor 410 is electrically connected to the floating diffusion region 420 through a conductive feature 1301, and the gate 413 of the reset transistor 412 is electrically connected to the doped region 418A through a conductive feature 1302. In other words, the transfer transistor 410 and the reset transistor 412 are in the diode-connected model. Note that the gate 211 or the gate 213 may be electrically connected to the radiation region 406 in some embodiments. In some embodiments, the gate 217 is electrically connected to the floating diffusion region 420, and the gate 413 is electrically connected to the doped region 418A. In some embodiments, the gate 217 is electrically connected to the floating diffusion region 420, and the gate 411 is electrically connected to the radiation region 406. In some embodiments, the gate 217 is electrically connected to the doped region 418A, the gate 413 is electrically connected to the floating diffusion region 420, and the gate 411 is electrically connected to the radiation region 406. In some embodiments, the gate is electrically connected to the doped region 418B, the gate 415 is electrically connected to the doped region 418C, and the gate 417 is electrically connected to the doped region 418D. In some embodiments, the gate 217 is electrically connected to the doped region 418D, and the gate 417 is electrically connected to the doped region 418C. For the sake of simplification, not all combinations are illustrated and described.

Figure 14:
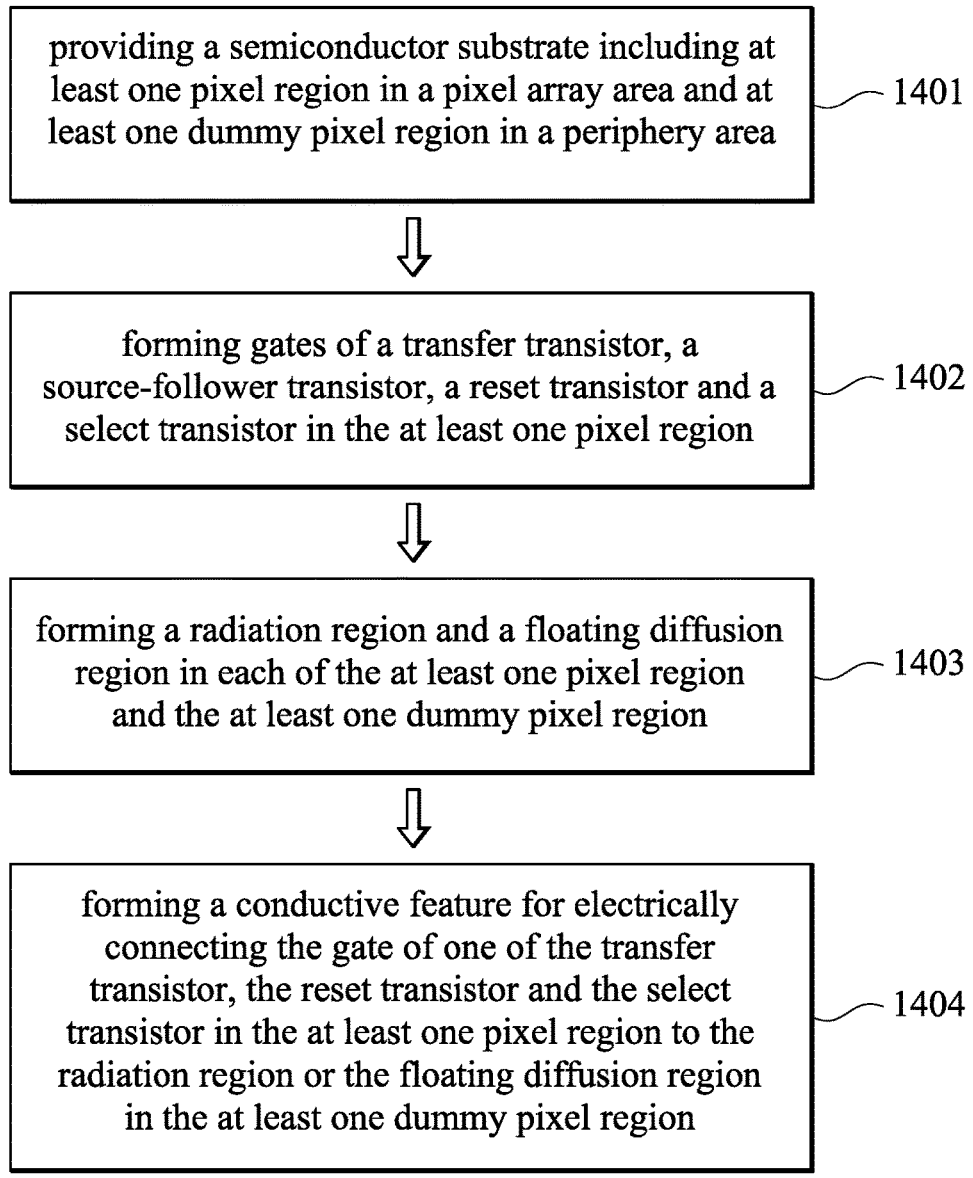
FIG. 14 is a diagram illustrating a flow chart of a method for manufacturing an image sensing device.

FIG. 14 is a diagram illustrating a flow chart of a method for manufacturing an image sensing device. Referring to FIG. 14, in operation 1401, a semiconductor substrate including at least one pixel region in a pixel array area and at least one dummy pixel region in a periphery area is provided. In operation 1402, gates of a transfer transistor, a source-follower transistor, a reset transistor and a select transistor are formed in the pixel region. In operation 1403, a radiation region and a floating diffusion region are formed in each of the pixel region and the dummy pixel region. In operation 1404, a conductive feature is formed for electrically connecting the gate of one of the transfer transistor, the reset transistor and the select transistor in the pixel region to the radiation region or the floating diffusion region in the dummy pixel region.

In accordance with some embodiments, an image sensing device is provided. The image sensing device includes at least one pixel region in a pixel array area and at least one dummy pixel region in a periphery area. The at least one pixel region includes a radiation region, a floating diffusion region, a transfer transistor, a source-follower transistor, a reset transistor and a select transistor. The at least one dummy pixel region includes a radiation region and a floating diffusion region. A gate of one of the transfer transistor, the reset transistor and the select transistor in the at least one pixel region is electrically connected to the radiation region or the floating diffusion region in the at least one dummy pixel region.

In accordance with some embodiments, an image sensing device is provided. The image sensing device includes at least one pixel region in a pixel array area and at least one dummy pixel region in a periphery area. The at least one pixel region includes a radiation region, a source-follower transistor, a reset transistor and a select transistor. The radiation region is electrically connected to a gate of the source-follower transistor and the reset transistor. The at least one dummy pixel region includes a radiation region. A gate of the reset transistor or the select transistor in the at least one pixel region is electrically connected to the radiation region in the at least one dummy pixel region.

In accordance with some embodiments, a method for manufacturing an image sensing device is provided. The method includes providing a semiconductor substrate including at least one pixel region in a pixel array area and at least one dummy pixel region in a periphery area; forming gates of a transfer transistor, a source-follower transistor, a reset transistor and a select transistor in the at least one pixel region; forming a radiation region and a floating diffusion region in each of the at least one pixel region and the at least one dummy pixel region; and forming a conductive feature for electrically connecting the gate of one of the transfer transistor, the reset transistor and the select transistor in the at least one pixel region to the radiation region or the floating diffusion region in the at least one dummy pixel region.

The above description of illustrated embodiments of the disclosure, including what is described in the Abstract, is not intended to be exhaustive or to limit the disclosure to the precise forms disclosed. While specific embodiments of, and examples for, the disclosure are described herein for illustrative purposes, various modifications are possible within the scope of the disclosure, as those skilled in the relevant art will recognize.

What is claimed is:

1. An image sensing device, comprising:
   a semiconductor substrate comprising a pixel array area and a periphery area adjacent to the pixel array area, the semiconductor substrate comprising:
   at least one pixel region in the pixel array area, wherein the at least one pixel region comprises a radiation region, a floating diffusion region, a transfer transistor, a source-follower transistor, a reset transistor and a select transistor; and
   at least one dummy pixel region in the periphery area, wherein the at least one dummy pixel region comprises a radiation region and a floating diffusion region,
   wherein a gate of one of the transfer transistor, the reset transistor and the select transistor in the at least one pixel region is electrically connected to the radiation region or the floating diffusion region in the at least one dummy pixel region,
   wherein the radiation region in the at least one dummy pixel region comprises a first pinned layer and a second pinned layer, a doping type of the first pinned layer is different from a doping type of the second pinned layer, and the doping type of the second pinned layer is different from a doping type of the semiconductor substrate.

2. The image sensing device of claim 1, wherein the floating diffusion region in the dummy pixel region comprises a first doped region and a second doped region, a doping type of the first doped region is identical to a doping type of the second doped region, the doping type of the second doped region is different from a doping type of the semiconductor substrate, the second doped region is located between the first doped region and the semiconductor substrate,
   wherein the gate of the one of the transfer transistor, the reset transistor and the select transistor in the at least one pixel region is electrically connected to the first doped region.

3. The image sensing device of claim 1, wherein the first pinned layer is a p-type doped region, the second pinned layer is a n-type doped region, and the semiconductor substrate is a p-typed doped substrate.

4. The image sensing device of claim 1, wherein the gate of the one of the transfer transistor, the reset transistor and the select transistor in the at least one pixel region is electrically connected to the first pinned layer.

5. The image sensing device of claim 1, wherein the first pinned layer is disposed along a front surface of the semiconductor substrate, and the first pinned layer is completely surrounded by the second pinned layer under the front surface of the semiconductor substrate.

6. The image sensing device of claim 5, wherein the radiation region in the at least one pixel region comprises a third pinned layer and a fourth pinned layer, a doping type of the third pinned layer is different from a doping type of the fourth pinned layer, and the doping type of the fourth pinned layer is different from the doping type of the semiconductor substrate,
   wherein the third pinned layer is disposed along the front surface of the semiconductor substrate, and the third pinned layer is partially surrounded by the fourth pinned layer under the front surface of the semiconductor substrate.

7. The image sensing device of claim 1, wherein a number of the at least one pixel region is more than one, the pixel regions and the at least one dummy pixel region are arranged in a same row,
   the gate of the reset transistor or the select transistor in each of the pixel regions is electrically connected to the radiation region or the floating diffusion region in the at least one dummy pixel region.

8. The image sensing device of claim 7, wherein a number of the at least one dummy pixel region is more than one, and the gate of the reset transistor or the select transistor in each of the pixel regions is electrically connected to the radiation region or the floating diffusion region in each of the dummy pixel regions.

9. The image sensing device of claim 1, wherein the semiconductor substrate is within a first wafer, a second wafer is bonded to the first wafer, and a circuit in the second wafer is electrically connected to the gate of the one of the transfer transistor, the reset transistor and the select transistor in the at least one pixel region in the first wafer.

10. The image sensing device of claim 1, wherein the at least one dummy pixel region further comprises a transfer transistor, a source-follower transistor, a reset transistor and a select transistor, and at least one of the transfer transistor, the source-follower transistor, the reset transistor and the select transistor in the at least one dummy pixel region is in a diode-connected model and is electrically connected to the gate of the one of the transfer transistor, the reset transistor and the select transistor in the at least one pixel region.

11. An image sensing device, comprising:
    a semiconductor substrate comprising a pixel array area and a periphery area adjacent to the pixel array area, the semiconductor substrate comprising:
    at least one pixel region in the pixel array area, wherein the at least one pixel region comprises a radiation region, a source-follower transistor, a reset transistor and a select transistor, wherein the radiation region is electrically connected to a gate of the source-follower transistor and the reset transistor; and
    at least one dummy pixel region in the periphery area, comprising a radiation region, wherein a gate of the reset transistor or the select transistor in the at least one pixel region is electrically connected to the radiation region in the at least one dummy pixel region, wherein the radiation region in the at least one dummy pixel region comprises a first pinned layer and a second pinned layer, a doping type of the first pinned layer is different from a doping type of the second pinned layer, and the doping type of the second pinned layer is different from a doping type of the semiconductor substrate.

12. The image sensing device of claim 11, wherein
the first pinned layer is a p-type doped region, the second pinned layer is a n-type doped region, and the semiconductor substrate is a p-typed doped substrate.

13. The image sensing device of claim 11, wherein the gate of the reset transistor or the select transistor in the at least one pixel region is electrically connected to the first pinned layer.

14. The image sensing device of claim 11, wherein the first pinned layer is disposed along a front surface of the semiconductor substrate, and the first pinned layer is completely surrounded by the second pinned layer under the front surface of the semiconductor substrate, wherein the radiation region in the at least one pixel region comprises a third pinned layer and a fourth pinned layer, a doping type of the third pinned layer is different from a doping type of the fourth pinned layer, and the doping type of the fourth pinned layer is different from the doping type of the semiconductor substrate, wherein the third pinned layer is disposed along the front surface of the semiconductor substrate, and the third pinned layer is partially surrounded by the fourth pinned layer under the front surface of the semiconductor substrate.

15. The image sensing device of claim 11, wherein a number of the at least one pixel region is more than one, and the pixel regions and the at least one dummy pixel region are arranged in a same row, wherein the gate of the reset transistor or the select transistor in each of the pixel regions is electrically connected to the radiation region in the at least one dummy pixel region.

16. The image sensing device of claim 15, wherein a number of the at least one dummy pixel region is more than one, and the gate of the reset transistor or the select transistor in each of the pixel regions is electrically connected to the radiation region in each of the dummy pixel regions.

17. The image sensing device of claim 11, wherein the semiconductor substrate is within a first wafer, a second wafer is bonded to the first wafer, and a circuit in the second wafer is electrically connected to the gate of the one of the reset transistor or the select transistor in the at least one pixel region in the first wafer.

18. An image sensing device, comprising:
a semiconductor substrate comprising a pixel array area and a periphery area, wherein the semiconductor substrate comprises:
at least one pixel region in the pixel array area, wherein the at least one pixel region comprises a radiation region, a floating diffusion region, a transfer transistor, a source-follower transistor, a reset transistor and a select transistor; and
at least one dummy pixel region in the periphery area, wherein the at least one dummy pixel region comprises a radiation region and a floating diffusion region,
wherein a gate of one of the transfer transistor, the reset transistor and the select transistor in the at least one pixel region is electrically connected to one of the radiation region and the floating diffusion region in the at least one dummy pixel region,
wherein a gate of another of the transfer transistor, the reset transistor and the select transistor in the at least one pixel region is electrically connected to another of the radiation region and the floating diffusion region in the at least one dummy pixel region,
wherein the radiation region in the at least one dummy pixel region comprises a first pinned layer and a second pinned layer, a doping type of the first pinned layer is different from a doping type of the second pinned layer, and the doping type of the second pinned layer is different from a doping type of the semiconductor substrate.

19. The image sensing device of claim 18,
wherein the first pinned layer is disposed along a front surface of the semiconductor substrate, and the first pinned layer is completely surrounded by the second pinned layer under the front surface of the semiconductor substrate.

20. The image sensing device of claim 18, wherein the semiconductor substrate is within a first wafer, a second wafer is bonded to the first wafer, and a circuit in the second wafer is electrically connected to the gate of the one of the transfer transistor, the reset transistor and the select transistor in the at least one pixel region in the first wafer.

\* \* \* \* \*